United States Patent [19]

Swamy et al.

[11] Patent Number: 5,571,996
[45] Date of Patent: Nov. 5, 1996

[54] TRACE CONDUCTOR LAYOUT CONFIGURATION FOR PRESERVING SIGNAL INTEGRITY IN CONTROL BOARDS REQUIRING MINIMUM CONNECTOR STUB SEPARATION

[75] Inventors: N. Deepak Swamy; Victor K. Pecone; Darrell Slupek, all of Austin, Tex.

[73] Assignee: Dell USA, L.P., Austin, Tex.

[21] Appl. No.: 375,327

[22] Filed: Jan. 17, 1995

[51] Int. Cl.⁶ .............................. H05K 1/18; H05K 1/14
[52] U.S. Cl. ................. 174/261; 174/35 R; 361/785; 361/791; 361/816; 439/59; 439/61; 439/62; 336/200
[58] Field of Search ...................... 361/785, 791, 361/788, 799, 800, 784, 816; 174/250, 261, 35 R; 439/59, 60, 61, 62; 336/200, 232

[56] References Cited

U.S. PATENT DOCUMENTS

| | | | |
|---|---|---|---|
| 2,942,212 | 6/1960 | Mynall | 336/30 |
| 3,080,541 | 3/1963 | Parker | 336/200 |
| 3,148,347 | 9/1964 | Morrison | 336/123 |
| 3,436,687 | 4/1969 | Andrews, Jr. et al. | 336/200 |
| 3,466,580 | 9/1969 | Bull | 336/200 |
| 5,398,046 | 3/1995 | Szegedi et al. | 345/174 |

*Primary Examiner*—Laura Thomas
*Attorney, Agent, or Firm*—Henry N. Garrana; Mark P. Kahler; Michelle M. Turner

[57] ABSTRACT

A circuit board is provided having a plurality of vias and uniformly spaced connector stubs arranged upon one or both outer surfaces of the control board. Sets of trace conductors are formed within the control board between the vias. The trace conductors are arranged in two planes within the control board, wherein trace conductors within one plane are laterally offset from trace conductors in the other plane. Laterally offset trace conductors allow close spacing of the trace conductor planes while maximizing the spacing between trace conductors and corresponding reference conductors also placed within the control board. Additionally, the trace conductors are serpentine-shaped when viewed from a perspective perpendicular to the planar surface of the control board. The serpentine shape, in conjunction with carefully controlled spacing between planes of trace conductors as well as between the trace conductor planes and reference conductors, provides high impedance trace conductors in a limited space area necessary to meet SCSI specifications.

19 Claims, 3 Drawing Sheets

TRACE CONDUCTOR LAYOUT CONFIGURATION FOR PRESERVING SIGNAL INTEGRITY IN CONTROL BOARDS REQUIRING MINIMUM CONNECTOR STUB SEPARATION

BACKGROUND OF THE INVENTION

1. Field of the Invention

This invention relates to a control board and more particularly to a high impedance, electrically decoupled set of trace conductors formed along layers within the printed circuit board.

2. Background of the Relevant Art

A backplane or backpanel, referred to herein as a "control board", is a special type of printed circuit board. The control board is sometimes referred to as a mother board in that it provides interconnection with two or more daughter boards coupled to the control board. The control board and daughter boards are all coupled together within an enclosure of an electronic product or system. Like all printed circuit boards, the control board typically comprises one or more layers of rigid laminate material on which printed trace conductors are formed.

Each daughter board may be used to provide mechanical and electrical support for a peripheral controller arranged thereon. The daughter board therefore includes numerous integrated and discrete circuits arranged upon one or both outer surfaces of the daughter board. The are many types of well known peripheral controllers such as, for example, floppy disk controllers, hard disk controllers, tape drive controllers, printer controllers, etc. Each peripheral controller and associated circuitry can therefore be arranged on each daughter board. Additionally, the circuitry of each daughter board is interconnected to other daughter board circuitry via connector stubs arranged in uniform rows across the control board.

Small computer system interface (SCSI) is designed to provide a standard interface between the host system and up to eight peripheral controllers. A peripheral controller associated with one daughter board may be purposefully designed according to the SCSI standard to send and receive signals to and from another peripheral controller arranged on a separate daughter board. The SCSI transmission protocol therefore advantageously allows direct data transferral from one peripheral device over the SCSI bus to another peripheral device without intervention from the host adapter. The host adapter might initiate the transfer, but the transfer of data proceeds directly between the two peripheral controllers. Direct data transferral between peripheral controllers thereby entails trace conductors placed within the control board between the connector stubs. Each connector stub is designed to frictionally engage and electrically connect with edge connectors arranged at one end of a respective daughter board. The connector stubs and interposed trace conductors associated with the control board ensures a SCSI bus direct data transferral.

The trace conductors which provide SCSI bus direct data transferral must be properly configured according to SCSI standards. SCSI standards dictate that the source and load impedances be somewhat matched. This requires that each trace conductors arranged between connector stubs have a closely controlled high impedance value defined in SCSI specification. In addition to impedance requirements, SCSI specification has further defined a minimum spacing between connector stubs. The connector stubs must be spaced a minimum distance apart to allow clearance between circuits arranged on adjacent daughter boards as well as to achieve SCSI performance. It is desirable that board manufacturers and personal computer (PC) manufacturers maintain connector stub separation as small as possible, i.e., just above the minimum guidelines. Connector stub separation beyond the minimum would add material cost to the overall board. When a mere fraction of a dollar on each control board provides an advantage in the cost competitive PC marketplace, manufacturers must target stub separation at SCSI minimum. The trace conductors which interconnect connector stubs must therefore achieve the SCSI impedance mandate but only within the limited area between stubs.

SUMMARY OF THE INVENTION

The problems outlined above are in large part solved by a circuit board having trace conductors which can meet stub separation limitations and the impedance requirements set forth in SCSI specification. That is, the control board hereof including a set of trace conductors configured between connector stubs. The trace conductors operatively couple signals from one SCSI controller to another SCSI controller to take full advantage of direct SCSI transfer between peripheral controllers.

Each trace conductor is preferably arranged in a serpentine configuration. The serpentine configuration provides the requisite stub separation within a fixed distance. The high impedance trace conductors are purposefully designed to meet SCSI control board requirements. Additionally, high impedance is provided within a relatively small board area in the limited space between adjacent connector stubs.

Generally speaking, impedance is a function of the ratio of inductance to capacitance. Impedance is shown to increase by not only increasing the length of the trace conductors, but also by increasing the spacing between the trace conductors and reference conductors (i.e., conductors connected to a reference voltage such as power or ground). Placing serpentine-shaped trace conductors as far away as possible from the reference conductors achieves the stated SCSI impedance goals. Interspersing adjacent serpentine conductors in such a way that the area of overlap is minimized helps in avoiding the pejorative affects of cross-talk between these conductors thereby meeting stub separation goals. Thus, the potential performance downside of placing trace conductors far away from the reference plane to satisfy high impendence requirements is overcome by staggering these conductors to eliminate crosstalk.

The control board hereof is manufactured with as few layers as possible in order to minimize manufacturing cost. Accordingly, the multi-layered control board uses only four internal layers in what is commonly known as a "dual microstrip" configuration. Dual microstrip entails two internal layers of trace conductors arranged between two internal layers of reference conductors. Impedance is controlled by carefully selecting the spacing between the layers of trace conductors and the layers of reference conductors. In the ideal, impedance can be increased by increasing the lateral dimension of the connector stub separation or the thickness of the control board to accommodate an increase in the number of reference planes between the trace conductors. However, to do so would unduly raise materials costs to accommodate added board width or increased layer count. A compromise is achieved herein by which the trace conductors are serpentine-configured as far away from the reference conductors as possible to maximize impedance, yet not so far as to (i) add unnecessary thickness to the control board and/or (ii) jeopardize a minimum spacing requirement between layers of trace conductors. In the latter instance, the layers of trace conductors must not be too close together since noise and cross-talk could occur. Therefore, the present trace conductors within one layer of trace conductors are interspersed between and laterally offset from trace conductors within another layer to maximize the spacing therebetween while minimizing the overall thickness of the resulting board.

Broadly speaking, the present invention contemplates a trace conductor layout configuration having the benefits of high impedance with low susceptibility to cross-talk between conductors. Moreover, the trace conductor layout configuration is achieved within a relatively thin control board having only four internal layers: two trace conductor layers and two reference conductor layers. The trace conductor layout configuration comprises a circuit board substrate having a pair of opposing planar surfaces. The layout configuration further comprises first and second layers or planes arranged within the circuit board substrate parallel to each other and parallel to the opposing planar surfaces. The layout configuration still further comprises a first pair of trace conductors formed parallel to each other across a portion of the first plane, and a second pair of trace conductors formed parallel to each other across a portion of the second plane. The first pair of trace conductors are laterally offset from the second pair of trace conductors.

According to one embodiment, the first pair of trace conductors are connected together and terminated at a first pair of vias. The second pair of trace conductors are also connected together and terminated at a second pair of vias. The first pair of vias extend between terminating ends of the first pair of trace conductors and one of the planar surfaces. The second pair of vias extend between terminating ends of the second pair of trace conductors and one of the opposing planar surfaces. First and second connector stubs, according to yet another embodiment, are coupled to the first and second pair of vias. Each connector stub of the first and second connector stubs is adapted for receiving edge terminals of a daughter board. According to still another embodiment, a circuit may be coupled to one of the opposing planar surfaces of the control board, and a plurality of surface trace connectors may be formed upon one of the opposing planar surfaces between the circuit and the first and/or second connector stubs.

A first reference layer or plane is preferably arranged in parallel between one of the opposing planar surfaces and the first plane on which trace conductors are formed. A second reference plane is preferably arranged in parallel between the other of the opposing planar surfaces and the second plane on which trace conductors are formed. A first reference conductor arranged within the first reference plane is connected to a first reference potential. A second reference conductor arranged within the second reference plane is connected to a second reference potential. The first and second reference conductors may be planar conductors, and the first reference potential can be a reference voltage equal to or dissimilar from the voltage of the second reference potential.

The circuit board generally includes more than a pair of first and second trace conductors. In many instances, a plurality of trace conductors may be used. According to one embodiment, the circuit board includes a first set of serpentine-shaped trace conductors extending within the first plane and a second set of serpentine-shaped trace conductors extending within the second plane. The second set of serpentine-shaped trace conductors are interspersed within and laterally offset from the first set of serpentine-shaped trace conductors. A first reference conductor extends a first spaced distance from the first set of serpentine-shaped trace conductors and a second reference conductor extends a second spaced distance from the second set of serpentine-shaped trace conductors. To maximize impedance of the first and second trace conductors, the first spaced distance is preferably equal to the second spaced distance, and the first and second spaced distances are as large as possible. Confined within a relatively thin control board, first and second spaced distances are enlarged by reducing the distance between layers of first and second trace conductors. However, offsetting the first trace conductors within one layer from the second trace conductors within the other adds to the lateral distance between trace conductors. Thus, any spacing decrease in the vertical dimension is compensated for by spacing in the lateral dimension. Adequate spacing between trace conductors is necessary to minimize interference or cross-talk between signals sent within those conductors.

BRIEF DESCRIPTION OF THE DRAWINGS

Other objects and advantages of the invention will become apparent upon reading the following detailed description and upon reference to the accompanying drawings in which.

Figure 1:
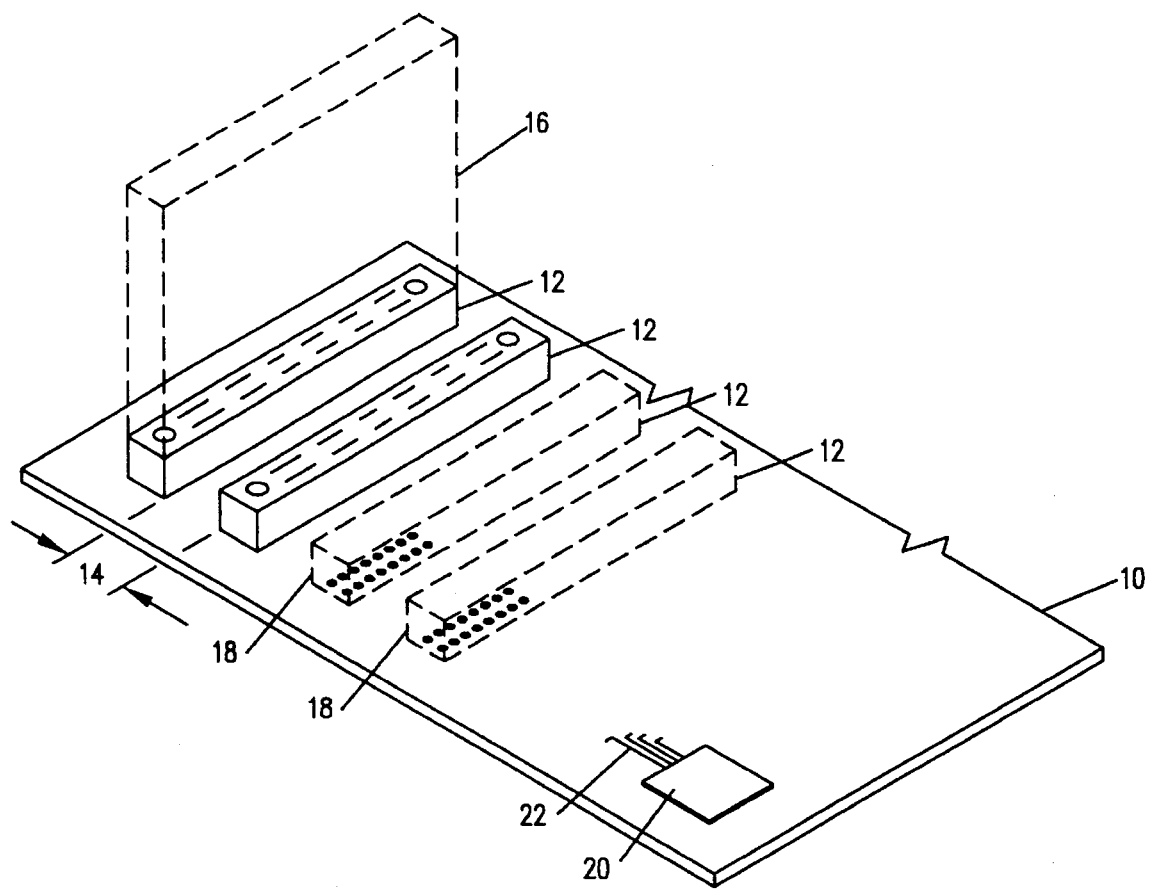
FIG. 1 is a perspective view of a control board having connector stubs and vias formed thereon.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a perspective view of control board 10 is shown. Control board 10 is a printed circuit board manufactured by subtractive or additive processes from rigid copper-clad, epoxy-impregnated glass fiber laminate, or glass fiber-filled epoxy laminate (commonly referred to as "FR-4"). Control board 10 is a multi-layered board having printed conductors or "trace conductors" formed within intermediate layers or planes of board 10. Control board 10 can further include printed conductors formed upon one or both opposed, outer surfaces.

Control board 10 includes one or more connector stubs 12 arranged a spaced distance 14 from each other. Connector stub 12 is of common design and generally encompass pins (not shown) interposed between vias 18 arranged upon control board 10 and edge connectors formed at one end of a daughter board engaged within the connector stub. Connector stubs 12 are thereby designed having one or more grooves or receptors which extend outward and are dimensioned to receive the daughter board edge connectors.

Daughter board 16 includes any PCB on which separately manufactured components have been added. The separately manufactured components may include, for example, peripheral controllers, whereby vias 18 electrically connect to printed conductors arranged upon or within daughter board 16. The peripheral controllers can be interfaced using an SCSI bus extending between daughter board 16 and a host system arranged upon another daughter board or control board 10. Control board 10 thereby suffices as a SCSI-type control board adapted to meet the specifications set forth in the SCSI standard.

SCSI standard dictates a defined spacing 14 between connector stubs 18. Specifically, spacing 14 must be no less than a certain minimum and for purposes of performance, not greater than a certain maximum. Board and PC manufacturers generally target their connector stub separation to meet the above range. Additionally, each inter-stub trace conductor must meet SCSI impedance requirements which is between 80 to 100 ohms. Still further, the high impedance trace conductors must be somewhat immune to noise or cross-talk between conductors on the same plane or dissimilar planes. A configuration which meets the above requirements is described in detail in reference to FIGS. 2 and 3.

Control board 10 may also include one or more circuits or electrical components 20 placed upon one or both opposing surfaces of board 10. Component 20 can be electrically connected to vias 18 by surface trace conductors 22 formed upon one or both opposing surfaces of board 10.

Figure 2:
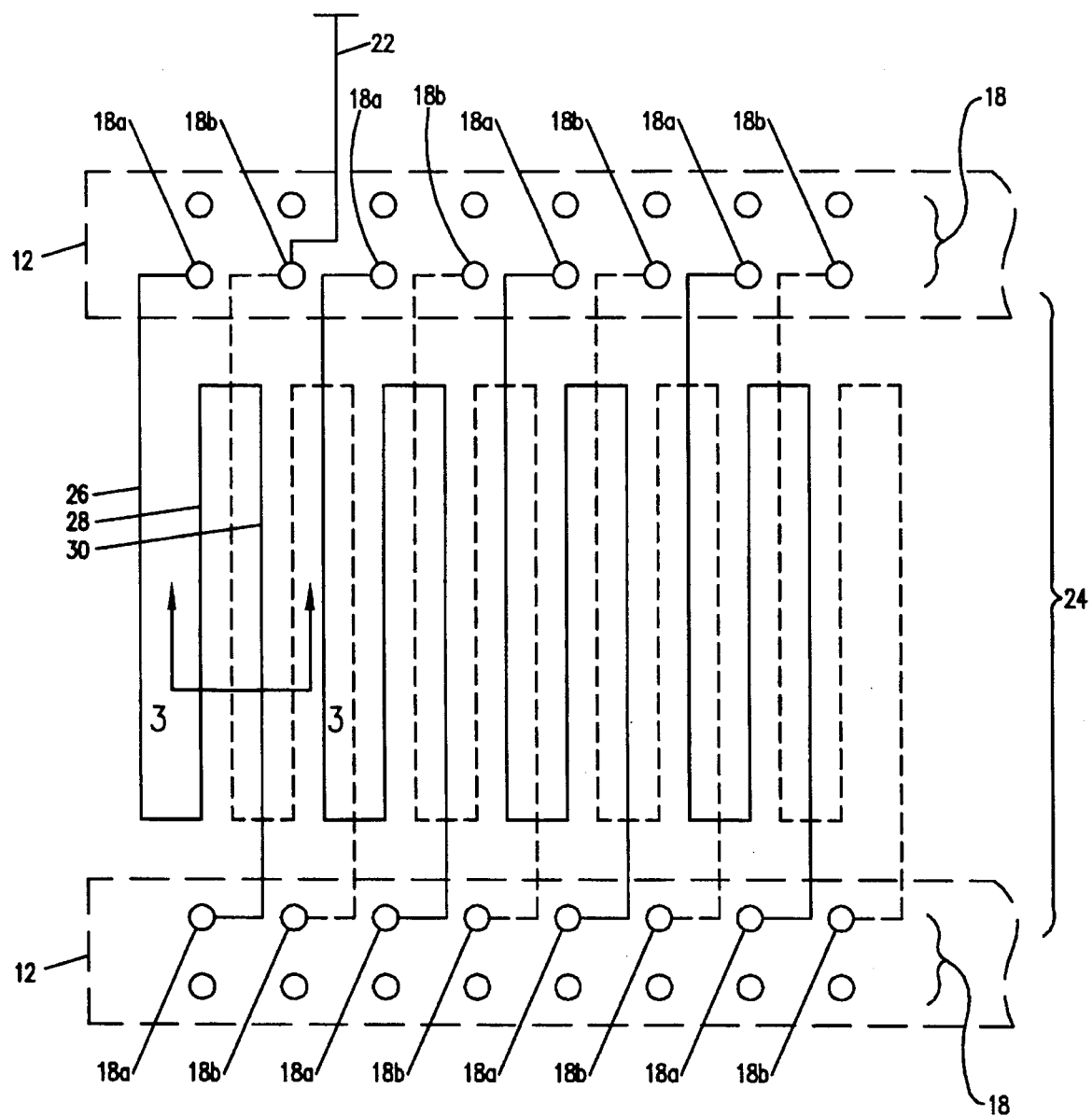
FIG. 2 is top plan view of a portion of the control board having serpentine-shaped trace conductors formed between connector stubs within dissimilar planes of the control board according to the present invention.

Turning now to FIG. 2, a top plan view of a portion of control board 10 is shown. From a perspective perpendicular to board 10 planar surface, a plurality of serpentine-shaped inter-stub trace conductors 24 are shown. Trace conductors 24 extend on two separate planes within control board 10. Terminating ends of each trace conductor are connected to respective vias 18. Vias 18 are interposed between pins within connector stub 12 and trace conductors 24 within control board 10. Trace conductors 24 provide a conduit over which signals can be sent between daughter boards 16. As such, trace conductors 24 can form part of the SCSI bus network which allows direct data transfer between peripheral controllers arranged on separate daughter boards.

The length of, for example, one serpentine-shaped trace conductor connected between a pair of vias 18a includes three substantially parallel elongated portions 26, 28 and 30. Trace conductors 24 connected between vias 18a are shown in solid line, whereas trace conductors 24 connected between vias 18b are shown in dashed line. The solid lines and dashed lines are used to indicate that the corresponding trace conductors are formed on dissimilar planes or layers within control board 10. The serpentine-shaped trace conductors connected between vias 18a form a first set of trace conductors at a planar elevation dissimilar from the second set of trace conductors connected between vias 18b. Spacing between corresponding planar levels or layers is necessary to prevent conduction at the crossover points. Separation amount, as a minimum, is determined as that amount sufficient to prevent electrical conduction, cross-talk or capacitive coupling at the cross-over point.

Figure 3:
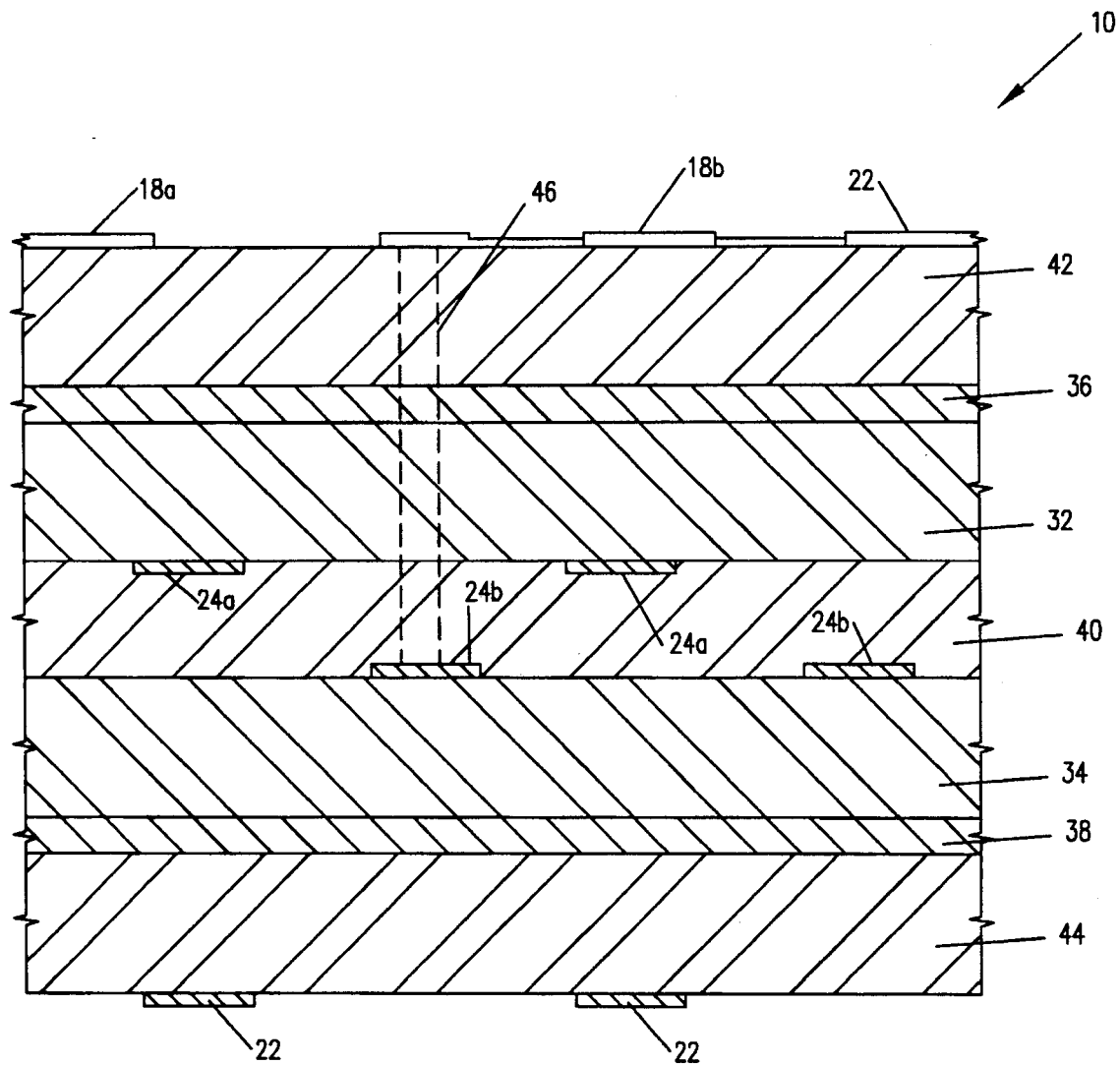
FIG. 3 is a cross-sectional view along plane 3—3 of FIG.

Turning now to FIG. 3, a cross-sectional view along plane 3—3 of FIG. 2 is shown. Specifically, FIG. 3 illustrates control board 10 having multiple layers or planes therein. For purposes of maintaining simplicity in manufacture as well as presenting a minimum thickness board, four internal planes or layers are used. Elongated portions, shown in cross-section, of a first pair of trace conductors 24a are formed within a first plane, and elongated portions, shown in cross-section, of a second pair of trace conductors 24b are formed within a second plane. First and second pairs of trace conductors 24a and 24b, respectively, are formed on corresponding laminate core material 32 and 34, respectively, by well-known photolithography techniques. The resulting trace conductors 24a and 24b can be of any dimension, a suitable dimension being 0.005 inches in width and 0.0007 inches in height. Of course, the length is dependent upon the required step spacing set forth in SCSI specification.

Core material 32 and 34 includes an appropriate resin placed upon a reinforcing fabric. A suitable resin includes FR-4 epoxy, and a suitable reinforcing fabric includes glass or glass fiber. The core material is dimensioned as having a thickness necessary to impart desired impedance to first and second pairs 24a and 24b (i.e., impart necessary spacing between first pairs 24a and first reference conductor 36 and impart necessary spacing between second pairs 24b and second reference conductor 38). A preferred thickness of core material 32 as well as core material 34 is approximately 0.025 inches. Once trace conductors 24a and 24b are photolithography formed, they are adjoined a spaced distance apart by a B-stage resin material 40. Material 40, when cured, fixes first pair of trace conductors 24a relative to second pair of trace conductors 24b.

Use of B-stage or "prepreg" material is well known. B-stage 40 may therebybe used to couple together two structures. Alignment is necessary during the coupling stage to ensure the elongated portions of first pair of trace conductors are laterally offset between, and spaced above, elongated portions of second pair of trace conductors 24b.

While FIG. 3 illustrates only a portion of the serpentine-shaped plurality of trace conductors, it nonetheless illustrates the lateral offset necessary to minimize cross-coupling or capacitive coupling between signals sent through first and second pairs of trace conductors 24a and 24b. The signals would be more susceptible to cross-coupling if, for example, trace conductors 24a were directly configured over trace conductors 24b, and not offset in accordance with the present invention. Offset allows for a thinner B-stage material 40 and a thicker core material 32 and 34 necessary to lessen the thickness of the overall circuit board while maximizing impedance (i.e., spacing) of trace conductors to respective reference conductors.

Conductors 36 and 38 within separate internal planes help decouple any noise transients within control board 10. First and second reference conductors 36 and 38 can be a solid planar conductive material extending across the entire planar area. Conductors 36 and 38 are formed as, for example, a copper foil at the backside surface of respective core elements 32 and 34. The copper foil is thereafter laminated by placing additional B-stage resin 42 and 44 upon the exposed copper foil. After curing, the B-stage resin 42 and 44 provides a surface on which another copper foil is coupled at one or both surfaces of the resulting control board 10. The B-stage material at regions 42 and 44 can be of any thickness sufficient to decouple surface conductors 22 from reference conductors 36 and 38, a suitable thickness being 0.014 inches. Buy etching the copper foil at the outer surface of B-stage material 42 and 44 (i.e., outer surface of board 10), various surface trace conductors 22 as well as vias 18a and 18b are formed.

Via 18b, shown in FIGS. 2 and 3 is connected on the surface of the control board to a surface trace conductor 22. Additionally, via 18b is connected to a vertical risor 46

(shown as a dashed line in FIG. 3). Vertical risor 46 extends between via 18b and a terminating end of the first pair of trace conductors 24b. Vertical risor 46 extends through an opening of first reference conductor 36 so as not to short thereto.

It is appreciated that each via, via 18a and via 18b (all vias 18) includes a vertical risor necessary to complete the inter-stub connection. Vias 18a and 18b connect to pins within connector stubs 12 which then connect to terminating ends of SCSI controller conductors arranged upon one or more daughter boards 16.

It will be appreciated to those skilled in the art having the benefit of this disclosure that this invention is capable of applications with any type of control board having SCSI interface capability. It is understood that the control card layers can be formed according to any laminate process using selective addition or removal of conductive elements arranged on exposed surfaces, and that the process can be repeated to form a multi-layer card of mechanical rigidity suitable as an interconnect backplane for one or more daughter boards. Various modifications and changes may be made to each fabrication step without departing from the spirit and scope of the invention as set forth in the claims. For example, serpentine-shaped trace conductors hereof can be formed in any configuration between connector stubs provided the trace conductors are of high impedance with corresponding high immunity to noise and cross-talk. The elongated portions can be aligned between the vias or placed orthogonal to an axis extending between the vias. Regardless of the orientation chosen, the intent remains the same— to lengthen and laterally offset trace conductors placed on alternating layers or planes. It is intended that the following claims be interpreted to embrace all such modifications and changes and, accordingly, the specification and drawings are to be regarded in an illustrative rather than a restrictive sense.

What is claimed is:

1. A trace conductor layout configuration within a control board, comprising:

a control board substrate having a pair of opposing planar surfaces;

first and second planes arranged within said control board substrate parallel to each other and parallel to said opposing planar surfaces;

a first pair of trace conductors formed parallel to each other across a portion of said first plane, said first pair of trace conductors being connected together and terminated at a first pair of vias, and a second pair of trace conductors formed parallel to each other across a portion of said second plane, said second pair of trace conductors being connected together and terminated at a second par of vias, wherein said first pair of trace conductors are laterally offset from said second pair of trace conductors; and first and second connector stubs coupled to said first and second pair of vias, wherein each said first and second connector stubs is adapted for receiving edge terminals of a daughter board.

2. The trace conductor layout configuration as recited in claim 1, wherein said first pair of trace conductors comprise two elongated portions of one serpentine-shaped trace conductor, and wherein said second pair of trace conductors comprise two elongated portions of another serpentine-shaped trace conductor.

3. The trace conductor layout configuration as recited in claim 1, wherein one of said first pair of conductors is spaced laterally between said second pair of trace conductors.

4. The trace conductor layout configuration as recited in claim 1, wherein one of said second pair of conductors is spaced laterally between said first pair of trace conductors.

5. The trace conductor layout configuration as recited in claim 1, further comprising a midpoint between said first pair of trace conductors, said midpoint resides a spaced distance directly over one of said second pair of trace conductors.

6. The trace conductor layout configuration as recited in claim 1, further comprising a midpoint between said second pair of trace conductors, said midpoint resides a spaced distance directly below one of said first pair of trace conductors.

7. The trace conductor layout configuration as recited in claim 1, wherein said first pair of vias extend between terminating ends of connected said first pair of trace conductors and one of said planar surfaces, and wherein said second pair of vias extend between terminating ends of connected said second pair of trace conductors and one of said opposing planar surfaces.

8. The trace conductor layout configuration as recited in claim 1, further comprising:

a circuit coupled to one of said opposing planar surfaces; and a plurality of surface trace conductors formed upon one of said opposing planar surfaces between said circuit and one of said first and second connector stubs.

9. A trace conductor layout configuration within a control board, comprising:

a control board substrate having a pair of opposing planar surfaces:

first and second planes arranged within said control board substrate parallel to each other and parallel to said opposing planar surfaces:

a first pair of trace conductors formed parallel to each other across a portion of said first plane a second pair of trace conductors formed parallel to each other across a portion of said second plane, wherein said first pair of trace conductors are laterally offset from said second pair of trace conductors;

a first reference plane arranged in parallel between said first plane and one of said opposing planar surfaces, and a second reference plane arranged in parallel between said second plane and the other of said opposing planar surfaces;

a first reference conductor connected to a first reference potential and arranged within said first reference plane; and a second reference conductor connected to a second reference potential and arranged within said second reference plane.

10. The trace conductor layout configuration as recited in claim 9, wherein said first and second reference conductors are planar conductors.

11. A trace conductor layout configuration within a control board, comprising:

a control board substrate having first and second planes arranged parallel to each other within said control board substrate;

a first set of serpentine-shaped trace conductors extending within said first plane;

a second set of serpentine-shaped trace conductors extending within said second plane, wherein said second set of serpentine-shaped trace conductors are interspersed within and laterally offset from said first set of serpentine-shaped trace conductors; and a first reference conductor extending a first spaced distance from said first set of serpentine-shaped trace conductors and a second reference conductor extending a second spaced distance from said second set of serpentine-shaped trace conductors.

12. The trace conductor layout configuration as recited in claim 11, wherein said first spaced distance is equal to said second spaced distance.

13. The trace conductor layout configuration as recited in claim 11, wherein each trace conductor of said first set of serpentine-shaped trace conductors comprises at least three elongated portions extending parallel to each other, and wherein each trace conductor of said second set of serpentine-shaped trace conductors comprises at least three elongated portions extending parallel to each other and parallel to the elongated portions of said first set of serpentine-shaped trace conductors.

14. The trace conductor layout configuration as recited in claim 13, wherein one of the three elongated portions of said second set of serpentine-shaped trace conductors resides a spaced distance directly below a midpoint between two of the three elongated portions of said first set of serpentine-shaped trace conductors.

15. The trace conductor layout configuration as recited in claim 13, wherein one of the three elongated portions of said first set of serpentine-shaped trace conductors resides a spaced distance directly above a midpoint between two of the three elongated portions of said second set of serpentine-shaped trace conductors.

16. The trace conductor layout configuration as recited in claim 11, wherein each of said first and second set of serpentine-shaped trace conductors comprises a pair of vias connected at terminating ends of respective said trace conductors.

17. The trace conductor layout configuration as recited in claim 16, further comprising first and second connector stubs coupled to a respective one of said pair of vias, wherein each said first and second connector stubs is adapted for receiving edge terminals of a daughter board.

18. The trace conductor layout configuration as recited in claim 17, further comprising:
a circuit coupled to one of said opposing planar surfaces; and
a plurality of surface trace conductors formed upon one of said opposing planar surfaces between said circuit and one of said first and second connector stubs.

19. Control board and daughter board interconnect configuration, comprising:
a control board comprising:
a control board substrate having first and second planes arranged parallel to each other within said control board substrate;
a first set of serpentine-shaped trace conductors extending within said first plane;
a second set of serpentine-shaped trace conductors extending within said second plane, said second set of serpentine-shaped trace conductors are interspersed within and laterally offset from said first set of serpentine-shaped trace conductors, wherein each trace conductor of said first set of serpentine-shaped trace conductors comprises at least three elongated portions extending parallel to each other, and wherein each trace conductor of said second set of serpentine-shaped trace conductors comprises at least three elongated portions extending parallel to each other and parallel to the elongated portions of said first set of serpentine-shaped trace conductors, and further wherein one of the three elongated portions of said second set of serpentine-shaped trace conductors resides a spaced distance directly below a midpoint between two of the three elongated portions of said first set of serpentine-shaped trace conductors; and
a first reference conductor extending a first spaced distance from said first set of serpentine-shaped trace conductors and a second reference conductor extending a second spaced distance from said second set of serpentine-shaped trace conductors, wherein said first spaced distance is equal to said second spaced distance;
a pair of vias connected at terminating ends of each respective said first and second sets of serpentine-shaped trace conductors;
first and second connector stubs coupled to a respective one of said pair of vias, wherein each said first and second connector stubs is adapted for receiving edge terminals of a daughter board; and
a daughter board comprising edge connectors coupled to one connector of said first and second connector stubs.

* * * * *